(12) United States Patent
Takiguchi

(10) Patent No.: US 7,504,664 B2
(45) Date of Patent: Mar. 17, 2009

(54) SEMICONDUCTOR OPTICAL DEVICE HAVING AN IMPROVED CURRENT BLOCKING LAYER AND MANUFACTURING METHOD THEREOF

(75) Inventor: Tohru Takiguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/373,167

(22) Filed: Mar. 13, 2006

(65) Prior Publication Data
US 2007/0045633 A1 Mar. 1, 2007

(30) Foreign Application Priority Data
Jul. 25, 2005 (JP) .............................. 2005-214565

(51) Int. Cl.
*H01L 27/15* (2006.01)
(52) U.S. Cl. .............................. 257/79; 257/85; 257/94; 257/102
(58) Field of Classification Search .................. 257/79, 257/82, 84, 85, 94, 95, 101, 102; 438/38, 438/39
See application file for complete search history.

(56) References Cited

U.S. PATENT DOCUMENTS 5,214,662 A 5/1993 Irikawa et al.
5,371,028 A * 12/1994 Koh ........................... 438/591
5,390,205 A * 2/1995 Mori et al. ............... 372/46.01
5,679,603 A 10/1997 Kimura et al.
5,804,840 A * 9/1998 Ochi et al. ..................... 257/94
5,872,022 A 2/1999 Motoda et al.
2003/0173571 A1* 9/2003 Kish et al. ..................... 257/85
2005/0040415 A1 2/2005 Kish, Jr. et al

FOREIGN PATENT DOCUMENTS

| JP | 5-13882 | 1/1993 |
|---|---|---|
| JP | 7-263365 | 10/1995 |
| JP | 9-129969 | 5/1997 |

* cited by examiner

*Primary Examiner*—Zandra Smith
*Assistant Examiner*—Paul E Patton
(74) *Attorney, Agent, or Firm*—Leydig, Voit & Mayer, Ltd.

(57) ABSTRACT

A semiconductor optical device includes an active layer, a current blocking layer on both sides of the active layer, and a cladding layer on both the active layer and the current blocking layer. The current blocking layer includes a buried layer, at least one intermediate layer of Al(Ga)InAs and a cover blocking layer. The cover blocking layer is located between the cladding layer and the Al(Ga)InAs layers and has a higher oxidation resistance than the Al(Ga)InAs layer. The current blocking layer is grown such that each Al(Ga)InAs layer is not exposed at the surface of the current blocking layer.

13 Claims, 9 Drawing Sheets

SEMICONDUCTOR OPTICAL DEVICE HAVING AN IMPROVED CURRENT BLOCKING LAYER AND MANUFACTURING METHOD THEREOF

BACKGROUND OF THE INVENTION

1. Field of the Invention

The present invention relates to a buried type semiconductor optical device having am improved current blocking layer and suitable for use as a semiconductor laser for optical communications for example, and a manufacturing method thereof.

2. Background Art

A buried type semiconductor laser has been used conventionally as one type of a semiconductor optical device. In such a semiconductor laser, an active layer for recombination and light emission is covered with a semiconductor material having a larger energy gap and a lower refractive index than the active layer. The active layer comprises at least an InAlGaAs type semiconductor material and, on both sides of the active layer, an InAlGaAs layer is formed to improve the operational characteristics at high temperature (see, for example, Japanese Laid-open Patent Publication No. 9-129969, page 1 and FIG. 1).

As described above, in a conventional semiconductor optical device, a barrier layer or current blocking layer is formed on both sides of the active layer by use of an InAlGaAs layer to improve the temperature characteristics. However, in this structure, a tip portion of the AlGaAs layer is exposed and oxidized during the manufacturing process. As a result, the cladding layer formed on the InAlGaAs layer may have an undulated surface or defects, which leads to degraded laser characteristics and reduced yield.

The present invention has been devised to solve the foregoing problems in the conventional technique. It is, therefore, an object of the present invention to provide a semiconductor optical device in which oxidation of the InAlGaAs layer as a current blocking layer is prevented to achieve good temperature characteristics and increased yield. The present invention also provides a method for manufacturing the semiconductor optical device having such a structure.

SUMMARY OF THE INVENTION

According to one aspect of the present invention, a semiconductor optical device comprises a substrate, an active layer formed in a ridge structure on the substrate, a current blocking layer provided on both sides of the active layer and a cladding layer provided on the current blocking layer and the active layer. The current blocking layer includes a buried layer, at least one intermediate blocking layer formed on the buried layer and a cover blocking layer formed on the intermediate blocking layer and covering the intermediate blocking layer. At least one intermediate blocking layer is Al(Ga)InAs blocking layer. Further, the cover blocking layer has a higher oxidation resistance than the Al(Ga)InAs blocking layer.

In other words, the cover blocking layer is formed to separate the Al(Ga)InAs blocking layer from the cladding layer to prevent exposure of the Al(Ga)InAs blocking layer.

Owing to this structure and manufacturing method, the cladding layer may be formed without defects and its surface may not be undulated, and resultantly the leakage current may be reduced. Thus, it is possible to produce semiconductor optical devices having good temperature characteristics with increased yield.

Other and further objects, features and advantages of the invention will appear more fully from the following description.

DETAILED DESCRIPTION OF THE PREFERRED EMBODIMENTS

First Embodiment

Figure 1:
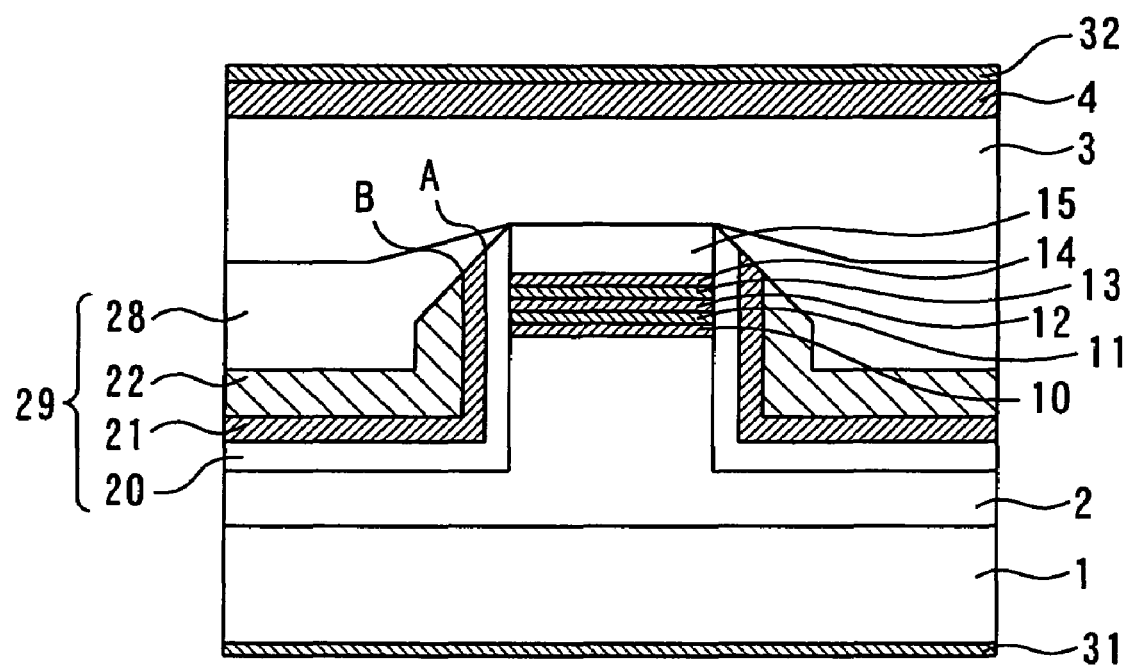
FIG. 1 is a cross-sectional view schematically showing a structure of a semiconductor laser according to a first embodiment of the present invention.

FIG. 1 is a cross-sectional view schematically showing a substantial portion of a semiconductor laser as one type of a semiconductor optical device according to a first embodiment of the present invention. Referring to FIG. 1, the semiconductor laser comprises a p-type InP substrate 1, a p-type InP layer 2 having a carrier concentration (P) of $1 \times 10^{18}$ cm$^{-3}$, a p-type AlInAs cladding layer 10 having a thickness of 100 nm and a carrier concentration (P) of $1 \times 10^{18}$ cm$^{-3}$, a p-type AlGaInAs light confining layer 11 having a thickness of 100 nm and a carrier concentration (P) of $1 \times 10^{18}$ cm$^{-3}$, an AlGaInAs pseudomorphic quantum well active layer 12, an n-type AlGaInAs light confining layer 13 having a thickness of 100 nm and a carrier concentration (N) of $1 \times 10^{18}$ cm$^{-3}$, an n-type AlInAs cladding layer 14 having a thickness of 100 nm and a carrier concentration (N) of $1 \times 10^{18}$ cm$^{-3}$ and an n-type InP layer 15 having a carrier concentration (N) of $1 \times 10^{18}$ cm$^{-3}$. Thus, an active layer is formed in a vertical ridge structure on the substrate 1 at a central portion of the device.

The semiconductor laser further comprises a current blocking layer 29 symmetrically provided on both sides of the active layer. The current blocking layer 29 includes a p-type InP buried layer 20 having a carrier concentration (P) of $1\times10^{18}$ cm$^{-3}$, a p-type Al(Ga)InAs blocking layer 21 having a carrier concentration (P) of $1\times10^{18}$ cm$^{-3}$, an n-type Al(Ga)InAs blocking layer 22 having a carrier concentration (N) of $7\times10^{18}$ cm$^{-3}$ and a p-type InP blocking layer 28 having a carrier concentration (P) of $1\times10^{18}$ cm$^{-3}$. Meanwhile, in the description of the present invention, each of the p-type Al(Ga)InAs blocking layer 21 and the n-type Al(Ga)InAs blocking layer 22 may be called as an intermediate blocking layer, and the p-type InP blocking layer 28 may be called as a cover blocking layer.

Further, an n-type InP layer 3 is formed as a cladding layer overriding the ridge-shaped active layer and the current blocking layer 29 on both sides of the active layer, and has a carrier concentration (N) of $1\times10^{18}$ cm$^{-3}$.

An n-type InP contact layer 4 is formed on the n-type InP layer 3, and has a carrier concentration (N) of $7\times10^{18}$ cm$^{-3}$. A p-type electrode (AuZn/Pt/Au) 31 and an n-type electrode (Ti/Pt/Au) 32 are also formed respectively.

Meanwhile, the expression "Al(Ga)InAs" as in the blocking layer 29 refers to the chemical formula Al$_x$Ga$_{1-x}$InAs (where $0<x\leq1$). The expression "AuZn/Pt/Au" as in the electrode 31 refers to AuZn, Pt and Au metal films laminated in that order with the AuZn film at the bottom and the Au film at the top. This notation will be used throughout the description.

One of the features of the present invention is that the current blocking layer 29 includes an Al(Ga)InAs layer. In the present embodiment, the current blocking layer 29 includes the p-type Al(Ga)InAs blocking layer 21 and the n-type Al(Ga)InAs blocking layer 22 as shown in FIG. 1. Since an Al(Ga)InAs blocking layer has a larger energy discontinuity ($\Delta$Ec) on the conduction band side than an InP layer, electrons are unlikely to jump and flow over the p-type Al(Ga)InAs blocking layer 21. Therefore, leakage current bypassing the active layer is reduced even at high temperatures. This allows the semiconductor laser to achieve good temperature characteristics.

Another feature of the present invention is that the Al(Ga)InAs blocking layer or layers included in the current blocking layer 29 is not exposed at the surface of the current blocking layer 29 during the manufacturing process. To be precisely, in the current blocking layer 29, between the cladding layer and the Al(Ga)InAs blocking layer, another blocking layer is interposed that has a higher oxidation resistance than the Al(Ga)InAs layer. Specifically, in the present embodiment, the Al(Ga)InAs blocking layers 21 and 22 are included in the current blocking layer 29 as shown in FIG. 1. And the p-type InP blocking layer 28 is interposed between the cladding layer 3 and the Al(Ga)InAs blocking layer 22.

The manufacturing method will now be described with reference to FIGS. 2(a) to 2(c), FIGS. 3(a) and 3(b), and FIGS. 4(a) and 4(b). These figures are cross-sectional views showing each manufacturing step conceptually. It should be noted that, in the following figures, like numerals are used to denote like or corresponding elements or components.

Figure 2A:
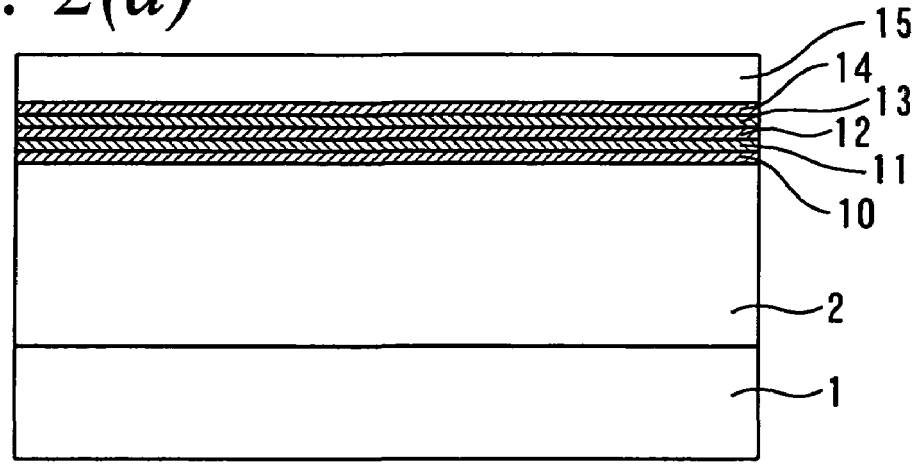
FIGS. 2(a) to 2(c), FIGS. 3(a) and 3(b), and FIGS. 4(a) and 4(b) are cross-sectional views showing each manufacturing step of a semiconductor laser according to a first embodiment of the present invention.
Figure 2B:
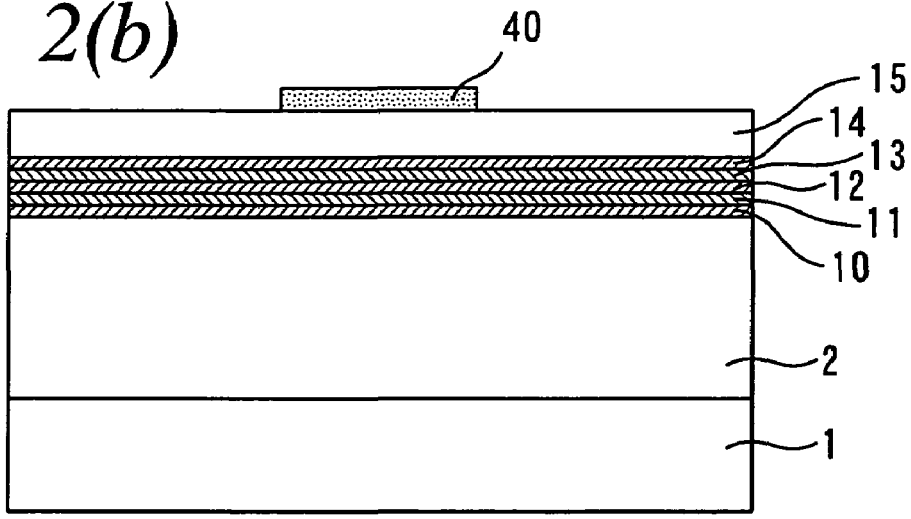
Figure 2C:
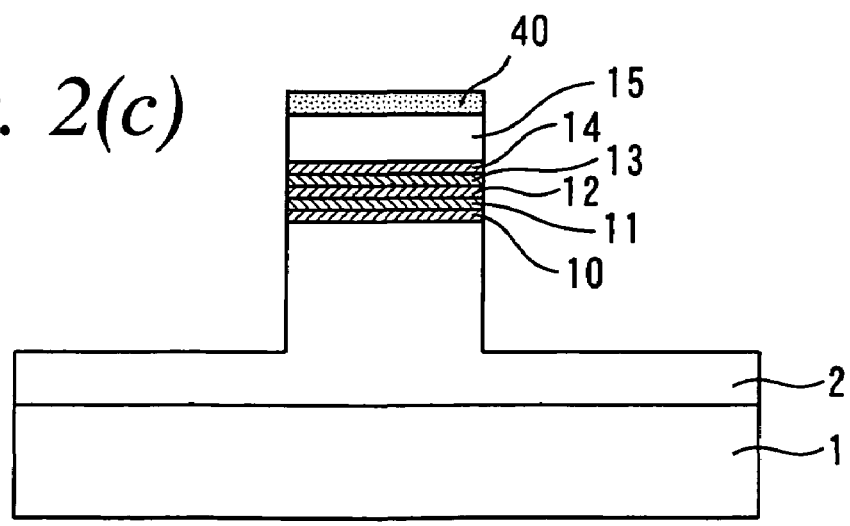

In the manufacturing method, sequentially grown on the p-type InP substrate 1 by an MOCVD technique are, as shown in FIG. 2(a), the p-type InP layer 2, the p-type AlInAs cladding layer 10, the p-type AlGaInAs light confining layer 11, the AlGaInAs strained quantum well active layer 12, the n-type AlGaInAs light confining layer 13, the n-type AlInAs cladding layer 14 and the n-type InP layer 15. Then, as shown in FIG. 2(b), a SiO$_2$ insulating film 40 is formed and patterned on the n-type InP layer 15. After that, a ridge structure is formed by methane-based dry etching, etc., as shown in FIG. 2(c).

Figure 3A:
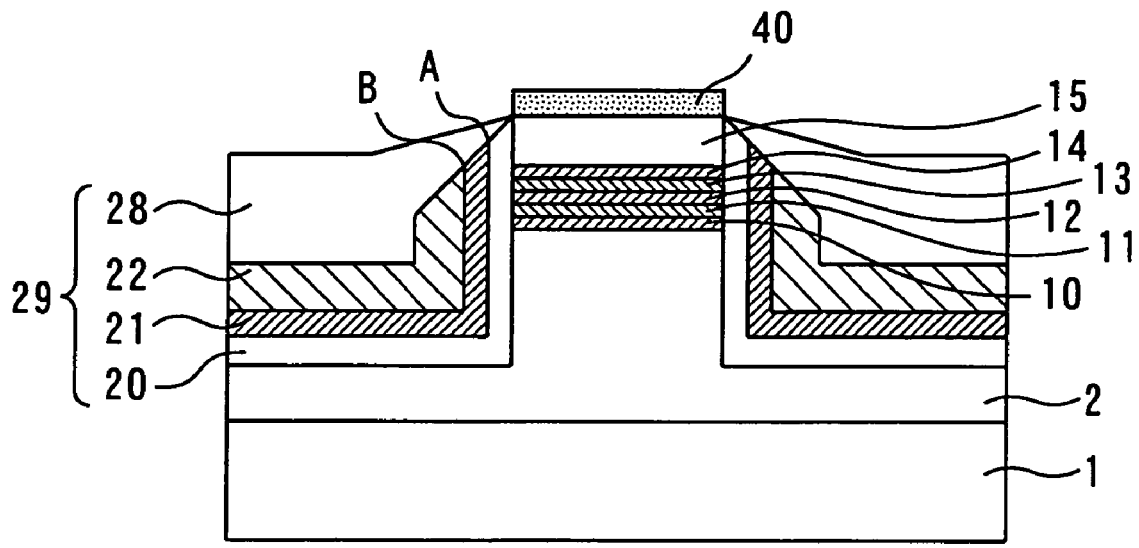
Figure 3B:
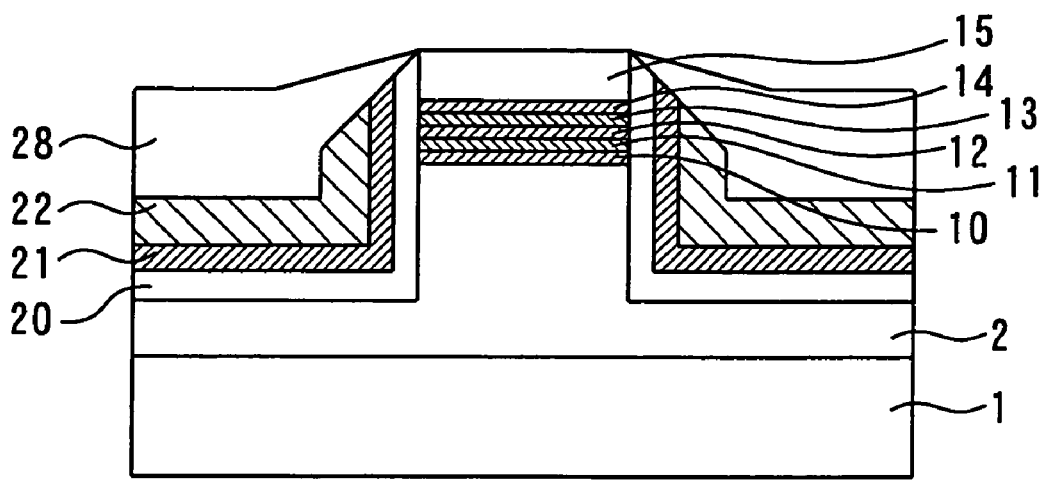
Figure 4A:
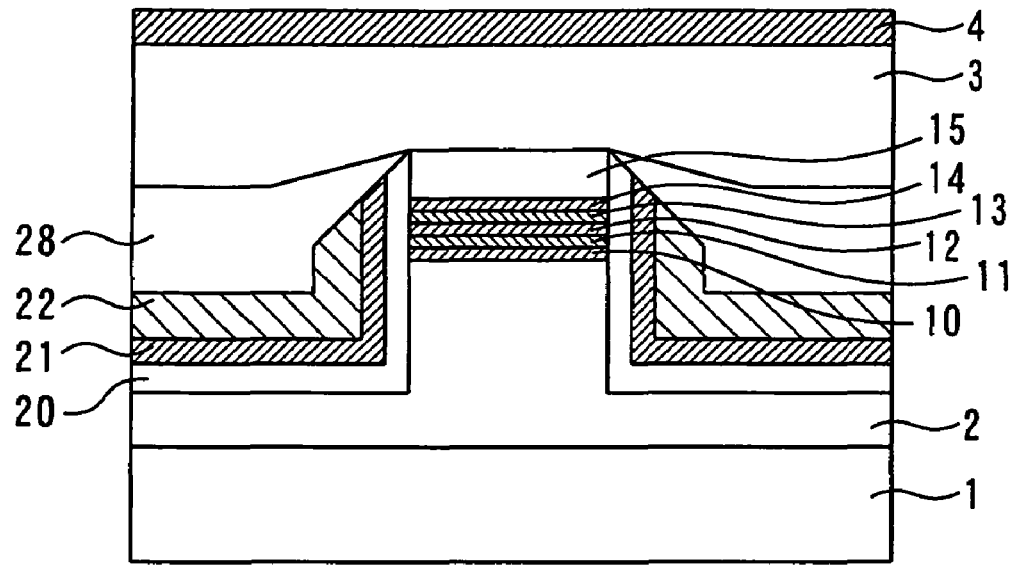
Figure 4B:
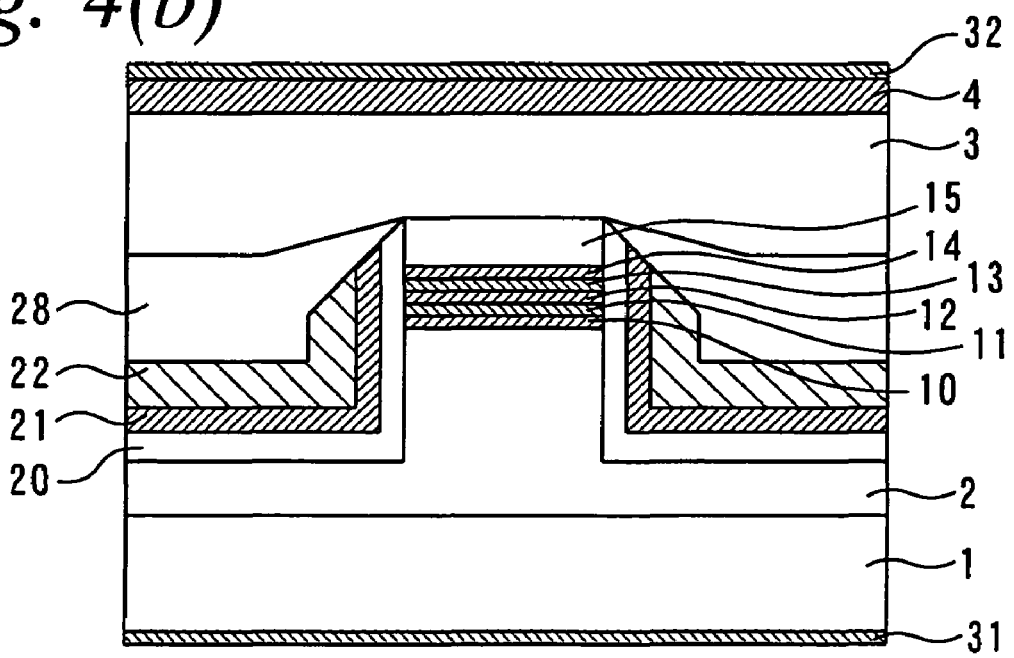

In the next step, as shown in FIG. 3(a), the p-type InP buried layer 20, the p-type Al(Ga)InAs blocking layer 21, the n-type Al(Ga)InAs blocking layer 22, and the p-type InP blocking layer 28 are grown sequentially by an MOCVD technique. Then, as shown in FIG. 3(b), the SiO$_2$ insulating film 40 is etched off. After that, the n-type InP layer 3 and the n-type InP contact layer 4 are grown by an MOCVD technique as shown in FIG. 4(a). Then, as shown in FIG. 4(b), the p-type electrode (AuZn/Pt/Au) 31 and the n-type electrode (Ti/Pt/Au) 32 are formed respectively.

As described above, in the present embodiment, the tip portion "A" of the p-type Al(Ga)InAs blocking layer 21 and the tip portion "B" of the n-type Al(Ga)InAs blocking layer 22 are not exposed at the surface of the current blocking layer 29 as shown in FIG. 3(a). Contrary, the top layer of the current blocking layer 29 is the p-type InP blocking layer 28 having oxidation resistance. It should be noted that if portions of the Al(Ga)InAs blocking layers 21 and 22 are exposed at the surface of the current blocking layer 29, then these exposed portions of the Al(Ga)InAs blocking layers 21 and 22 are oxidized during the process of etching off the SiO$_2$ insulating film 40 shown in FIG. 3(b). If this happens, the n-type InP layer 3 is not properly grown as a cladding layer on the oxidized surfaces of the Al(Ga)InAs blocking layers 21, 22 in the process of forming the n-type InP layer 3 shown in FIG. 4(a). As a result, the n-type InP layer 3 may have an undulated surface or defects, which leads to degraded laser characteristics and reduced yield.

Figure 5A:
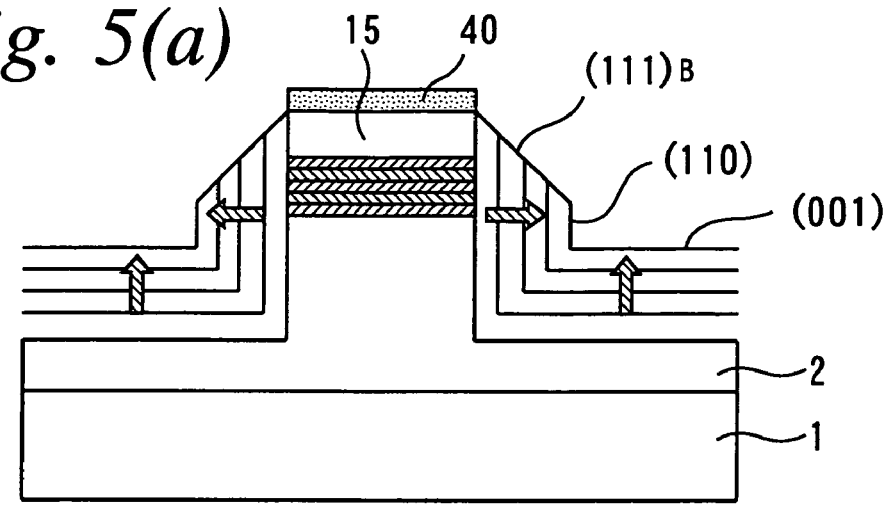
FIGS. 5(a) to 5(c) are cross-sectional views illustrating the crystal growth of the current blocking layer on the side surface of the ridge portion in the semiconductor laser.
Figure 5B:
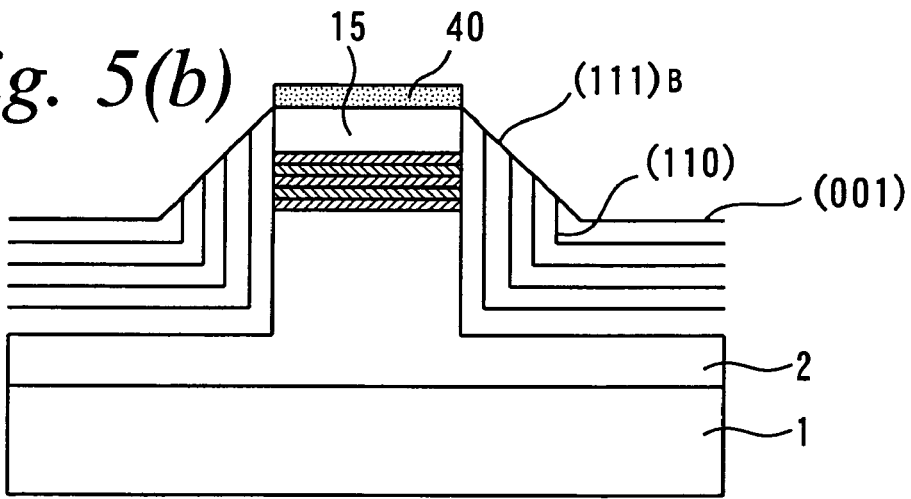
Figure 5C:
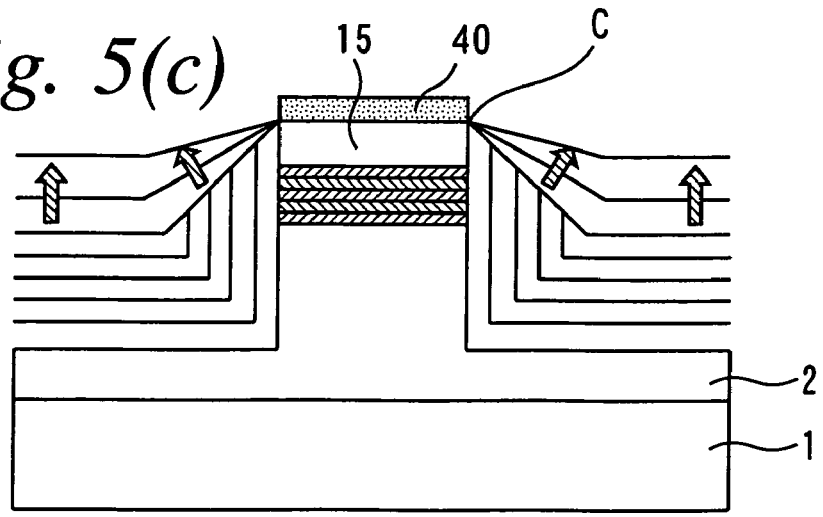

Now, the mechanism to prevent surface exposure of the Al(Ga)InAs blocking layer is explained with reference to FIGS. 5(a) to 5(c). In the present embodiment, the p-type Al(Ga)InAs blocking layer 21 and the n-type Al(Ga)InAs blocking layer 22 are prevented from being exposed at the surface. FIGS. 5(a) to 5(c) are cross-sectional views conceptually illustrating the crystal growth of the current blocking layer 29 on the side surface of the ridge portion in the semiconductor laser shown in FIG. 1. The process proceeds from the step of FIG. 5(a) to that of FIG. 5(c).

In the beginning, as shown in FIG. 5(a), the crystal begins to grow upward from the bottom surface ((001)-plane) and sideward from the side surface ((110)-plane) of the ridge respectively. At this time, crystal does not grow on the oblique surfaces ((111)B-plane).

In the present embodiment, the growth of the p-type Al(Ga)InAs blocking layer 21 and the n-type Al(Ga)InAs blocking layer 22 are stopped before the vertical or upright sides ((110)-plane) shown in FIG. 5(b) disappear. The crystal growth process is controlled in this way. Thereafter, the top surface is covered with the InP blocking layer 28 having a higher oxidation resistance than Al(Ga)InAs blocking layer, thereby preventing the Al(Ga)InAs layer from being exposed at the surface of the current blocking layer 29. This process allows the n-type InP layer or cladding layer 3 to be grown in crystal form on the top surface such that it has no defects. According to this process, the n-type InP layer 3 may be grown in crystal form as a cladding layer without defects on the top surface. As a result, it is possible to produce semiconductor lasers having good temperature characteristics in high yield.

It should be noted that if the crystal continues to grow after reaching the state shown in FIG. 5(a), the upright sides ((110)-plane) will completely disappear and the resultant top surface will be composed of only the oblique surfaces ((111)-plane) and the bottom surface ((001)-plane) as shown in FIG. 5(b). If this happens, then crystal growth occurs not only on the bottom surface ((001)-plane) but also on the oblique surfaces ((111)B-plane) and this growth continues. If the Al(Ga)

InAs layer continue to grow after the upright sides ((110)-plane) have completely disappeared, the tips of the Al(Ga)InAs layer are formed to reach at the right and left edges "C" of the ridge portion, as shown in FIG. 5(c), and exposed. In such a case, the exposed portions of the Al(Ga)InAs blocking layers are oxidized and hence the n-type InP layer 3 is not properly grown thereon. As a result, the n-type InP layer 3 may have an undulated surface or defects, which leads to degraded laser characteristics and reduced yield.

As described above, in summary, the present invention provides an improved method of manufacturing a semiconductor optical device that has an upright ridge structure and a current blocking layer formed on both sides of the ridge structure. The current blocking layer is formed to include at least one blocking layer of Al(Ga)InAs. The Al(Ga)InAs blocking layer is grown in such a manner that the crystal growth of the Al(Ga)InAs blocking layer is stopped before crystal begins to grow on a (111)B-plane.

In other words, each of the Al(Ga)InAs blocking layer is formed to have a vertical or upright side surface parallel to a side surface of the ridge structure of the active layer. Still in other words, each of the Al(Ga)InAs blocking layer is formed completely below the cover blocking layer.

Second Embodiment

Figure 6:
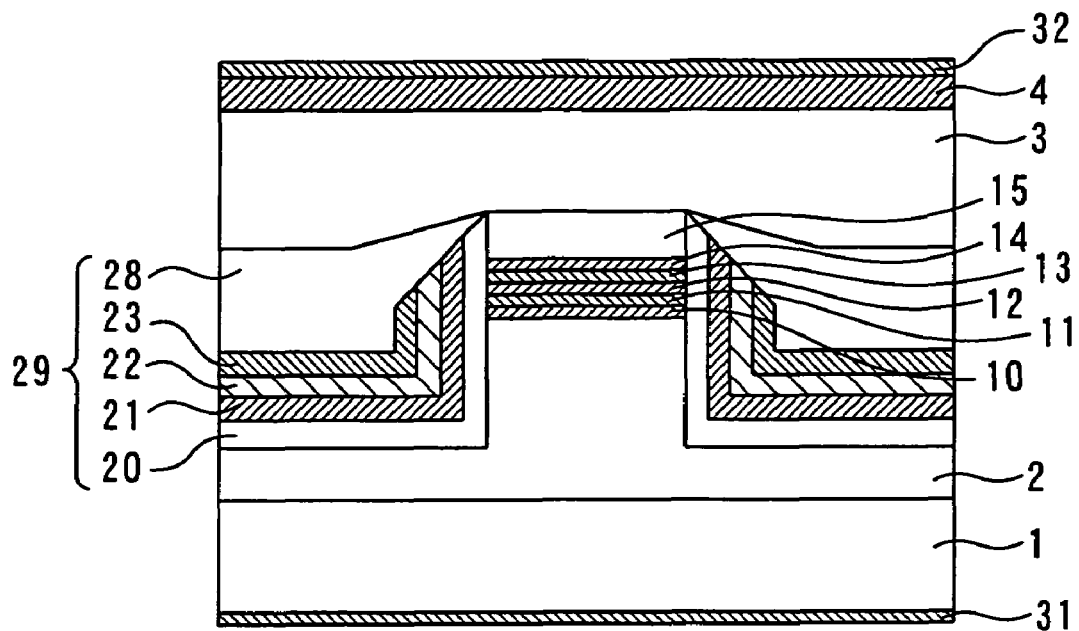
FIG. 6 is a cross-sectional view schematically showing a structure of a semiconductor laser according to a second embodiment of the present invention.

FIG. 6 is a cross-sectional view schematically showing a substantial portion of a semiconductor laser according to a second embodiment of the present invention. Referring to FIG. 6, the semiconductor laser comprises a p-type Al(Ga)InAs blocking layer 23 having a carrier concentration (P) of $1 \times 10^{18}$ cm$^{-3}$ formed between the n-type Al(Ga)InAs blocking layer 22 and the p-type InP blocking layer 28. All other elements or components are similar to those described in connection with the first embodiment and therefore no further description thereof will be provided. It should be noted that in the foregoing and following description of preferred embodiments of the present invention, like numerals are used to denotes corresponding components. It is assumed that the corresponding components are made of the same materials and have the same configuration and thickness. Furthermore, they have the same carrier concentration and dopant concentration if any.

The second embodiment is similar to the first embodiment shown in FIG. 1 except that the p-type Al(Ga)InAs blocking layer 23 is added into the current blocking layer 29. According to the present embodiment, as in the first embodiment described above, the crystal growth process is controlled such that the growth of the Al(Ga)InAs blocking layers including the p-type Al(Ga)InAs blocking layer 23 is stopped before the upright sides ((110)-plane) shown in FIG. 5(b) disappear, so that the Al(Ga)InAs blocking layers 21, 22, and 23 are not exposed at the surface of the current blocking layer 29. Since the current blocking layer 29 of the present embodiment additionally includes the p-type Al(Ga)InAs blocking layer 23, the leakage current is further reduced at high temperatures, as compared to the first embodiment, allowing the semiconductor laser to achieve better temperature characteristics.

Third Embodiment

Figure 7:
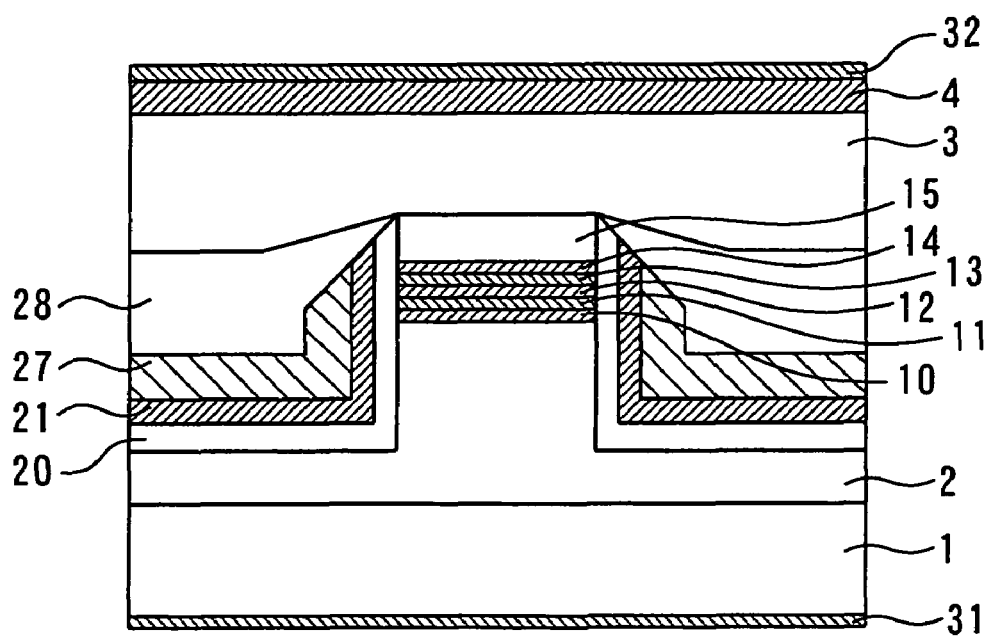
FIG. 7 is a cross-sectional view schematically showing a structure of a semiconductor laser according to a third embodiment of the present invention.

FIG. 7 is a cross-sectional view schematically showing a substantial portion of a semiconductor laser according to a third embodiment of the present invention. Referring to FIG. 7, the semiconductor laser comprises an n-type InP blocking layer 27 having a carrier concentration (N) of $7 \times 10^{18}$ cm$^{-3}$ formed between the p-type Al(Ga)InAs blocking layer 21 having a carrier concentration (P) of $1 \times 10^{18}$ cm$^{-3}$ and the p-type InP blocking layer 28 having a carrier concentration (P) of $1 \times 10^{18}$ cm$^{-3}$. The third embodiment is different from the first embodiment in that the current blocking layer 29 includes the n-type InP blocking layer 27 instead of the n-type Al(Ga)InAs blocking layer 22 shown in FIG. 1. All other components are similar to those shown in FIG. 1 described in connection with the first embodiment.

According to the present embodiment, as in the first embodiment, the crystal growth process is controlled such that the growth of the p-type Al(Ga)InAs blocking layer 21 is stopped before the upright sides ((1 10)-plane) shown in FIG. 5(b) disappear, so that the p-type Al(Ga)InAs blocking layer 21 is not exposed at the surface of the current blocking layer 29. The present embodiment does not include the n-type Al(Ga)InAs blocking layer 22 shown in FIG. 1 described in connection with the first embodiment. However, the leakage current is still small at high temperatures, as compared to conventional structures, allowing the semiconductor laser to achieve good temperature characteristics.

Fourth Embodiment

Figure 8:
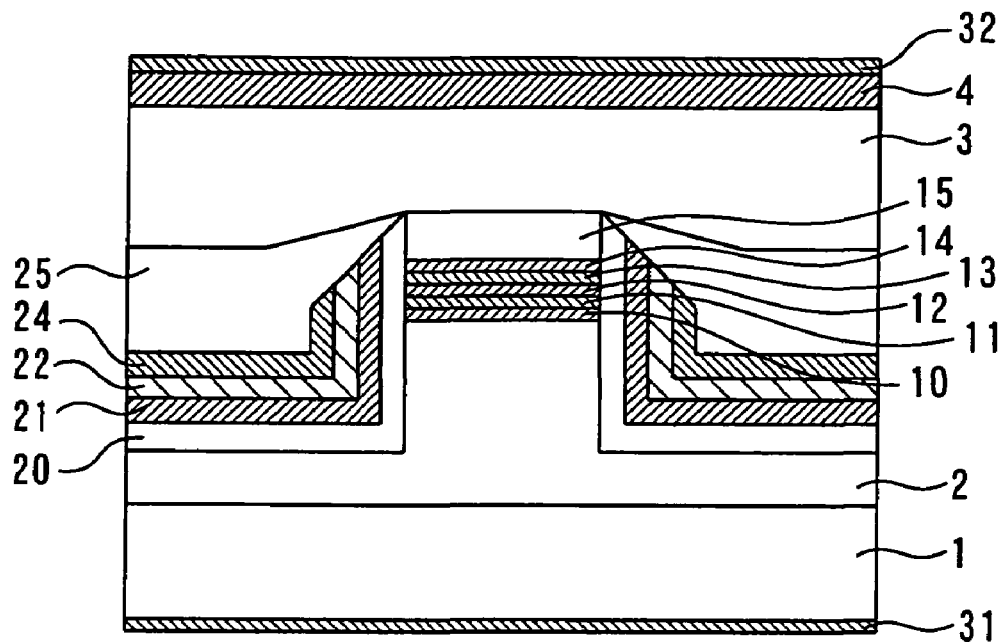
FIG. 8 is a cross-sectional view schematically showing a structure of a semiconductor laser according to a fourth embodiment of the present invention.

FIG. 8 is a cross-sectional view schematically showing a substantial portion of a semiconductor laser according to a fourth embodiment of the present invention. Referring to the FIG. 8, the semiconductor laser comprises a Fe-doped Al(Ga)InAs blocking layer 24 having an Fe concentration of $4 \times 10^{16}$ cm$^{-3}$ formed on the n-type Al(Ga)InAs blocking layer 22 having a carrier concentration (N) of $7 \times 10^{18}$ cm$^{-3}$. An n-type InP blocking layer 25 having a carrier concentration (N) of $2 \times 10^{18}$ cm$^{-3}$ is formed on the Fe-doped Al(Ga)InAs blocking layer 24. It should be noted that the crystal growth of the Fe-doped Al(Ga)InAs blocking layer 24 is stopped before the upright sides ((110-plane) shown in FIG. 5(b) disappear, so that the Fe-doped Al(Ga)InAs blocking layer 24 is not exposed at the surface of the current blocking layer 29 during the process of etching off the SiO$_2$ insulating film 40.

The present embodiment is different from the first embodiment in that the Fe-doped Al(Ga)InAs blocking layer 24 is additionally formed on the n-type Al(Ga)InAs blocking layer 22. Further, the n-type InP blocking layer 25 having a higher oxidation resistance than Al(Ga)InAs blocking layers is used instead of the p-type InP blocking layer 28. All other components are similar to those described in connection with the first embodiment.

Thus, the current blocking layer 29 of the present embodiment includes the semi-insulating Fe-doped Al(Ga)InAs blocking layer 24, which further reduces the leakage current at high temperatures. As a result, it is possible to produce semiconductor lasers having good temperature characteristics in high yield. It should be noted that the Fe-doped Al(Ga)InAs blocking layer 24 has semi-insulating properties. Instead of Fe, a different dopant such as Ru may be used to obtain such properties. Further, a low-temperature-grown Al(Ga)InAs layer may be used instead of the Fe-doped Al(Ga)InAs blocking layer 24 with the same effect.

Fifth Embodiment

Figure 9:
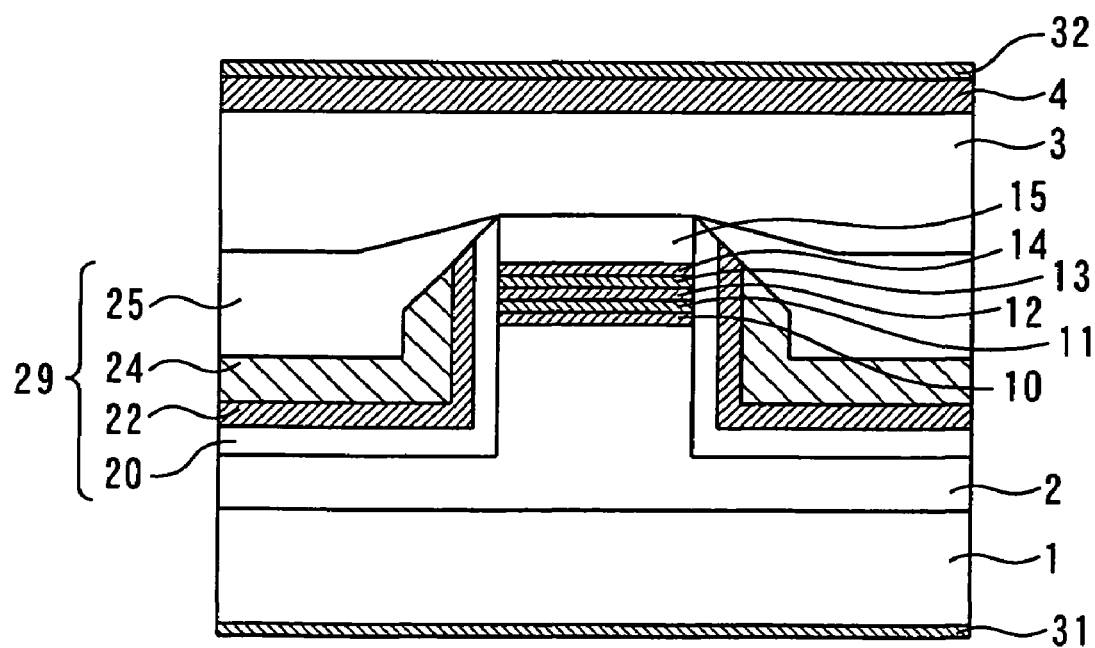
FIG. 9 is a cross-sectional view schematically showing a structure of a semiconductor laser according to a fifth embodiment of the present invention.

FIG. 9 is a cross-sectional view schematically showing a substantial portion of a semiconductor laser according to a fifth embodiment of the present invention. Referring to the FIG. 9, formed on the surface of the p-type InP buried layer 20 having a carrier concentration (P) of $1 \times 10^{18}$ cm$^{-3}$ are the n-type Al(Ga)InAs blocking layer 22 having a carrier concentration (N) of $7\times10^{18}$ cm$^{-1}$, the Fe-doped Al(Ga)InAs blocking layer 24 having an Fe concentration of $4\times10^{16}$ cm$^{-3}$ and the n-type InP blocking layer 25 having a carrier concentration (N) of $2\times10^{18}$ cm$^{-3}$. That is, the present embodiment is different from the fourth embodiment in that the current blocking layer 29 does not include the p-type Al(Ga)InAs blocking layer 21. All other components are similar to those described in connection with the fourth embodiment and therefore no further description thereof will be provided.

Thus, according to the present embodiment, the current blocking layer 29 includes the n-type Al(Ga)InAs blocking layer 22, the Fe-doped Al(Ga)InAs blocking layer 24, and the n-type InP blocking layer 25 that has oxidation resistance. The n-type InP blocking layer 25 is formed between the Fe-doped Al(Ga)InAs blocking layer 24 and the n-type InP layer (or cladding layer) 3 to prevent the Fe-doped Al(Ga)InAs blocking layer 24 from being exposed at the surface of the current blocking layer 29. This structure produces the same effect as the fourth embodiment. It should be noted that an Ru-doped Al(Ga)InAs blocking layer or a low-temperature-grown Al(Ga)InAs layer may be used, instead of the Fe-doped Al(Ga)InAs blocking layer 24, with the same effect.

Sixth Embodiment

Figure 10:
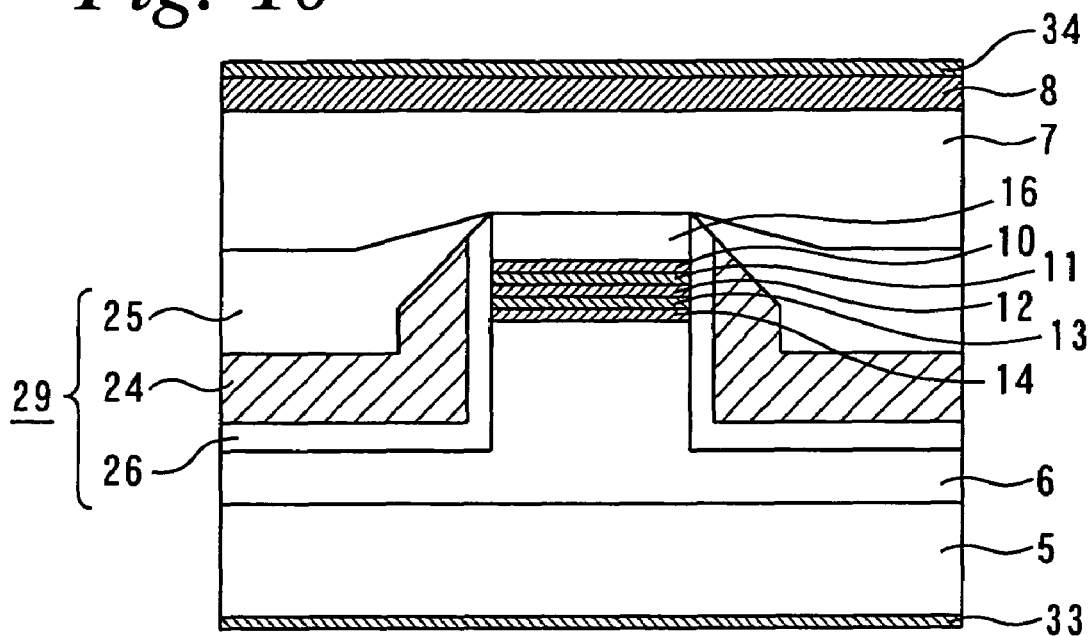
FIG. 10 is a cross-sectional view schematically showing a structure of a semiconductor laser according to a sixth embodiment of the present invention.

FIG. 10 is a cross-sectional view schematically showing a substantial portion of a semiconductor laser according to a sixth embodiment of the present invention. Referring to the FIG. 10, the semiconductor laser comprises an n-type InP substrate 5, an n-type InP layer 6 having a carrier concentration (N) of $1\times10^{18}$ cm$^{-3}$, an n-type AlInAs cladding layer 14 having a thickness of 100 nm and a carrier concentration (N) of $1\times10^{18}$ cm$^{-3}$, an n-type AlGaInAs light confining layer 13 having a thickness of 100 nm and a carrier concentration (N) of $1\times10^{18}$ cm$^{-3}$, an AlGaInAs strained quantum well active layer 12, a p-type AlGaInAs light confining layer 11 having a thickness of 100 nm and a carrier concentration (P) of $1\times10^{18}$ cm$^{-3}$, a p-type AlInAs cladding layer 10 having a thickness of 100 nm and a carrier concentration (P) of $1\times10^{18}$ cm$^{-3}$ and a p-type InP layer 16 having a carrier concentration (P) of $1\times10^{18}$ cm$^{-3}$.

The current blocking layer 29 comprises an Fe-doped InP buried layer 26 having a semi-insulating characteristics with an Fe concentration of $4\times10^{16}$ cm$^{-3}$, an Fe-doped Al(Ga)InAs blocking layer 24 having a semi-insulating characteristics with an Fe concentration of $4\times10^{16}$ cm$^{-3}$ and an n-type InP blocking layer 25 having a carrier concentration (N) of $2\times10^{18}$ cm$^{-3}$. A p-type InP layer 7 is formed as a cladding layer and has a carrier concentration (P) of $1\times10^{18}$ cm$^{-3}$. Further, a p-type InGaAs contact layer 8 is formed and has a carrier concentration (P) of $1\times10^{19}$ cm$^{-3}$. An n-type electrode (AuGe/Ni/Au) 33 and a p-type electrode (Ti/Pt/Au) 34 are also formed respectively.

Thus, the current blocking layer 29 of the present embodiment includes the Fe-doped Al(Ga)InAs blocking layer 24 instead of a pnpn current blocking layer. It should be noted that when the blocking layers 26, 24, and 25 constituting the current blocking layer 29 is grown in crystal form, the growth of the Fe-doped Al(Ga)InAs blocking layer 24 is completed before the upright sides ((110)-plane) shown in FIG. 5(b) disappear, so that the Fe-doped Al(Ga)InAs blocking layer 24 is not exposed at the surface of the current blocking layer 29, as in the first embodiment.

In the sixth embodiment configured as described above, the Fe-doped InP buried layer 26 and the Fe-doped Al(Ga)InAs blocking layer 24 have the property of trapping electrons, allowing the leakage current to be reduced. Further, as described above, the growth of the Fe-doped Al(Ga)InAs blocking layer 24 is stopped before the upright sides ((110)-plane) shown in FIG. 5(b) disappear, so that the Fe-doped Al(Ga)InAs blocking layer 24 is not exposed at the surface of the current blocking layer 29. Therefore, the Fe-doped Al(Ga)InAs blocking layer 24 is not oxidized during the process of etching off the SiO$_2$ insulating film 40. As a result, the p-type InP layer (or cladding layer) 7 can be grown on the top surface of the current blocking layer 29 without defects, making it possible to produce semiconductor lasers having good temperature characteristics in high yield.

It should be noted that an Ru-doped Al(Ga)InAs blocking layer or a low-temperature-grown Al(Ga)InAs layer may be used, instead of the semi-insulating Fe-doped Al(Ga)InAs blocking layer 24, with the same effect. Further, the semi-insulating Fe-doped InP buried layer 26 may be replaced by an Ru-doped InP buried layer, with the same effect.

Seventh Embodiment

Figure 11:
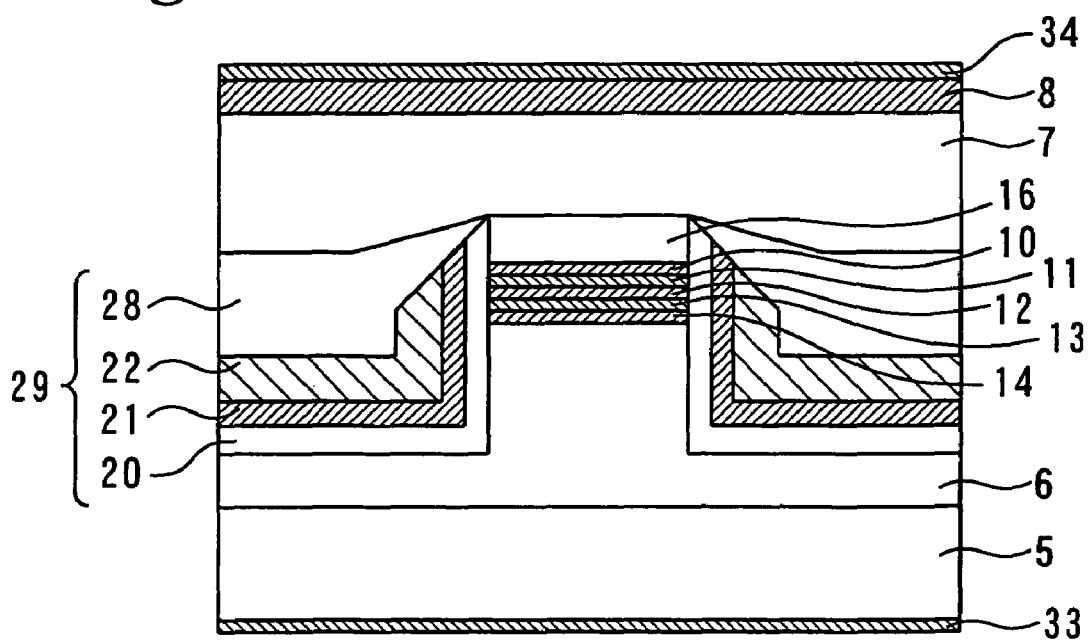
FIG. 11 is a cross-sectional view schematically showing a structure of a semiconductor laser according to a seventh embodiment of the present invention.

FIG. 11 is a cross-sectional view schematically showing a substantial portion of a semiconductor laser according to a seventh embodiment of the present invention. Referring to the FIG. 11, the semiconductor laser comprises a p-type InP buried layer 20 having a carrier concentration (P) of $1\times10^{18}$ cm$^{-3}$, a p-type Al(Ga)InAs blocking layer 21 having a carrier concentration (P) of $1\times10^{18}$ cm$^{-3}$, an n-type Al(Ga)InAs blocking layer 22 having a carrier concentration (N) of $7\times10^{18}$ cm$^{-3}$ and a p-type InP blocking layer 28 having a carrier concentration (P) of $1\times10^{18}$ cm$^{-3}$. The current blocking layer 29 of the present embodiment is formed in the same manner as that of the first embodiment. However, the present embodiment employs an n-type InP substrate 6 instead of the p-type InP substrate 1.

Also in the present embodiment described above, the Al(Ga)InAs blocking layers 21 and 22 are not exposed at the surface of the current blocking layer 29. Therefore, the p-type InP layer (or cladding layer) 7 can be grown without defects, making it possible to produce semiconductor lasers having good temperature characteristics in high yield.

Eighth Embodiment

Figure 12:
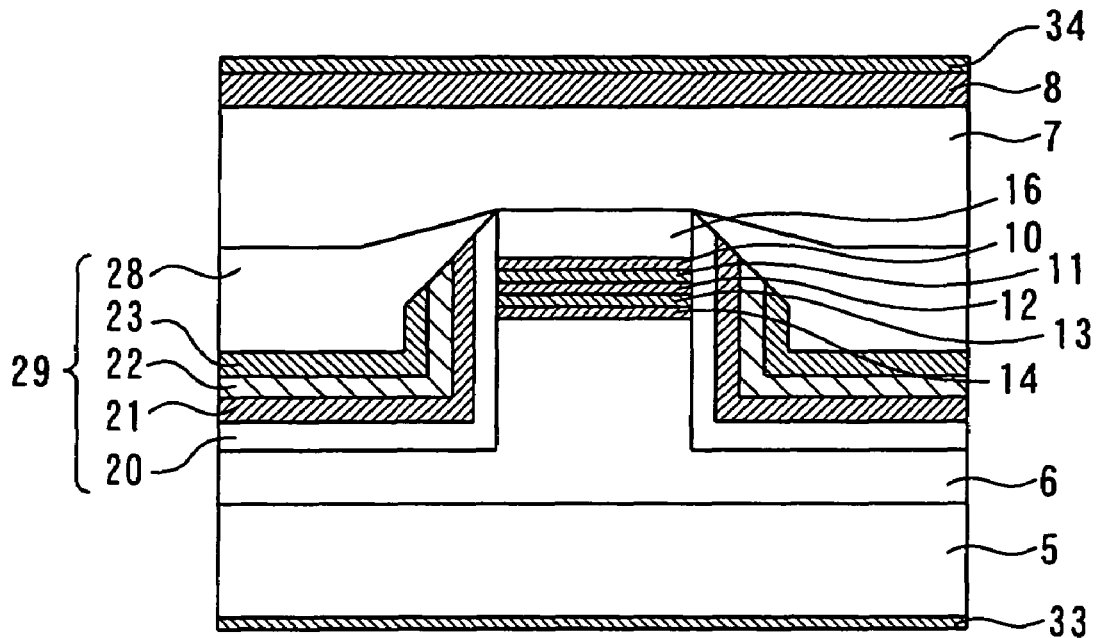
FIG. 12 is a cross-sectional view schematically showing a structure of a semiconductor laser according to an eighth embodiment of the present invention.

FIG. 12 is a cross-sectional view schematically showing a substantial portion of a semiconductor laser according to an eighth embodiment of the present invention. Referring to the FIG. 12, the semiconductor laser comprises a p-type Al(Ga)InAs blocking layer 23 having a carrier concentration (P) of $1\times10^{18}$ cm$^{-3}$ formed between the n-type Al(Ga)InAs blocking layer 22 having a carrier concentration (N) of $7\times10^{18}$ cm$^{-3}$ and the p-type InP blocking layer 28 having a carrier concentration (P) of $1\times10^{18}$ cm$^{-3}$. Thus, the current blocking layer 29 of the present embodiment is formed in the same manner as that of the second embodiment. However, the present embodiment employs an n-type InP substrate instead of the p-type InP substrate.

Also in the present embodiment, the crystal growth process is controlled such that the Al(Ga)InAs blocking layers 21, 22, and 23 are not exposed at the top surface of the current blocking layer 29. Furthermore, the p-type InP blocking layer 28 having an oxidation resistance is formed on the top surface of the current blocking layer 29, allowing the p-type InP layer (or cladding layer) 7 to be grown without defects. As a result, it is possible to produce semiconductor lasers having good temperature characteristics in high yield.

Ninth Embodiment

Figure 13:
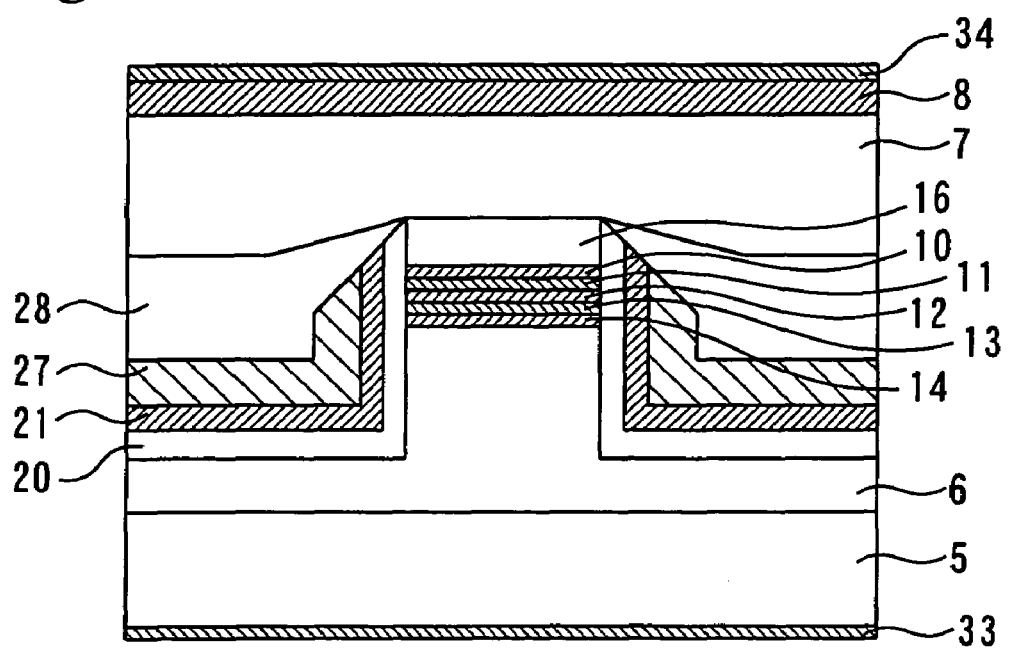
FIG. 13 is a cross-sectional view schematically showing a structure of a semiconductor laser according to a ninth embodiment of the present invention.

FIG. 13 is a cross-sectional view schematically showing a substantial portion of a semiconductor laser according to a ninth embodiment of the present invention. Referring to the FIG. 13, the semiconductor laser uses an n-type InP substrate 5. Further, an n-type InP blocking layer 27 having a carrier concentration (N) of $7 \times 10^{18}$ cm$^{-3}$ and a p-type InP blocking layer 28 having a carrier concentration (P) of $1 \times 10^{18}$ cm$^{-3}$ are sequentially formed on the p-type Al(Ga)InAs blocking layer 21 having a carrier concentration (P) of $1 \times 10^{18}$ cm$^{-3}$. All other components are similar to those described in connection with the eighth embodiment. Thus, the present embodiment employs the n-type InP substrate 5 instead of the p-type InP substrate 1 described in connection with the third embodiment. The present embodiment is also formed such that the Al(Ga)InAs blocking layer 21 is not exposed at the surface of the current blocking layer 29.

According to the present embodiment, when the p-type Al(Ga)InAs blocking layer 21 is formed, the crystal growth of the p-type Al(Ga)InAs blocking layer 21 is completed before the upright sides ((110)-plane) shown in FIG. 5(b) disappear, thereby preventing the p-type Al(Ga)InAs blocking layer 21 from being exposed at the surface of the current blocking layer 29. According to this method, the p-type InP layer 7 grows without defects. As a result, it is possible to produce semiconductor lasers having good temperature characteristics in high yield.

Although the foregoing description of each preferred embodiment has specified a carrier concentration or dopant concentration for each blocking layer in the current blocking layer 29, it is to be understood that these values have been given by way of example only and the present invention is not limited to those specified value. Further, the substrates, active layers, electrodes, etc. of the present invention are not limited to the materials, concentrations, thicknesses, and types described in connection with the embodiments. For example, the AlGaInAs strained quantum well active layer 12 may be replaced by another type of active layer formed of a different material such as an InGaAsP strained quantum well active layer or having a different structure, with the same effect. Still further, while the present invention has been described in connection with semiconductor lasers, it is to be understood that the invention may be applied to other semiconductor optical devices such as photoreceptor devices and optical waveguides.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-214565, filed on Jul. 25, 2005 including specification, claims, drawings and summary, on which the Convention priority of the present application is based, are incorporated herein by reference in its entirety.

The invention claimed is:

1. A semiconductor optical device comprising:
a substrate;
a ridge structure supported by said substrate and including opposed side surfaces, said ridge structure including an active layer and first and second cladding layers on opposite sides of said active layer, said active layer and said first and second cladding layers being exposed at said opposed side surfaces of said ridge structure; and
a current blocking structure contacting both of said opposed side surfaces of said ridge structure, said current blocking structure including a buried layer, at least one intermediate layer on said buried layer, and a cover layer on said intermediate layer and covering said intermediate layer, wherein
said at least one intermediate layer is Al(Ga)InAs,
said cover layer has a higher oxidation resistance than said Al(Ga)InAs intermediate layer,
said buried layer and said cover layer are InP, and
said Al(Ga)InAs intermediate layer has a side surface parallel to a side surface of said ridge structure.

2. The semiconductor optical device according to claim 1, wherein said substrate is a p-type substrate, said buried layer is p-type InP, and said intermediate layer is a p-type Al(Ga)InAs layer.

3. The semiconductor optical device according to claim 2, wherein said intermediate layer comprises an n-type Al(Ga)InAs layer on said p-type Al(Ga)InAs layer.

4. The semiconductor optical device according to claim 3, wherein said intermediate layer comprises a p-type Al(Ga)InAs layer on said n-type Al(Ga)InAs layer.

5. The semiconductor optical device according to claim 3, wherein said intermediate layer comprises a semi-insulating Al(Ga)InAs layer on said n-type Al(Ga)InAs layer.

6. The semiconductor optical device according to claim 2, wherein said intermediate layer comprises an n-type InP layer on said p-type Al(Ga)InAs layer.

7. The semiconductor optical device according to claim 1, wherein said substrate is a p-type substrate, said buried layer is p-type InP, and said intermediate layer is an n-type Al(Ga)InAs layer.

8. The semiconductor optical device according to claim 7, wherein said intermediate layer comprises a semi-insulating Al(Ga)InAs layer on said n-type Al(Ga)InAs layer.

9. The semiconductor optical device according to claim 1, wherein said substrate is a n-type substrate, said buried layer is semi-insulating InP, and said intermediate layer is semi-insulating Al(Ga)InAs.

10. The semiconductor optical device according to claim 1, wherein said substrate is an n-type substrate, said buried layer is p-type InP, and said intermediate layer is p-type Al(Ga)InAs.

11. The semiconductor optical device according to claim 10, wherein said intermediate layer comprises an n-type Al(Ga)InAs layer on said p-type Al(Ga)InAs layer.

12. The semiconductor optical device according to claim 11, wherein said intermediate layer comprises a p-type Al(Ga)InAs layer on said n-type Al(Ga)InAs layer.

13. The semiconductor optical device according to claim 10, wherein said intermediate layer comprises an n-type InP layer on said p-type Al(Ga)InAs layer.

* * * * *